US009406442B2

(12) United States Patent
Manohara et al.

(10) Patent No.: US 9,406,442 B2
(45) Date of Patent: Aug. 2, 2016

(54) MICRO- AND NANOSCALE CAPACITORS THAT INCORPORATE AN ARRAY OF CONDUCTIVE ELEMENTS HAVING ELONGATED BODIES

(71) Applicant: California Institute of Technology, Pasadena, CA (US)

(72) Inventors: Harish Manohara, Arcadia, CA (US); Linda Y. Del Castillo, Arcadia, CA (US); Mohammed M. Mojarradi, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 210 days.

(21) Appl. No.: 13/804,301

(22) Filed: Mar. 14, 2013

(65) Prior Publication Data

US 2013/0250479 A1 Sep. 26, 2013

Related U.S. Application Data

(60) Provisional application No. 61/614,128, filed on Mar. 22, 2012.

(51) Int. Cl.
*H01G 4/14* (2006.01)
*H01G 4/01* (2006.01)
(Continued)

(52) U.S. Cl.
CPC ........ *H01G 4/14* (2013.01); *B82Y 10/00* (2013.01); *H01G 4/01* (2013.01); *H01G 4/232* (2013.01);
(Continued)

(58) Field of Classification Search
CPC ............ H01L 28/90; H01G 4/14; H01G 4/01; H01G 4/012

USPC .............................. 361/313, 311, 321.5, 524
See application file for complete search history.

(56) References Cited

U.S. PATENT DOCUMENTS

| 5,827,602 | A  | 10/1998 | Koch et al. |
| 6,819,542 | B2 | 11/2004 | Guo et al. |

(Continued)

FOREIGN PATENT DOCUMENTS

| JP | 03129914 A | * | 6/1991 | ............ H03H 9/145 |
| JP | 05021281 A |   | 1/1993 |                         |

(Continued)

OTHER PUBLICATIONS

International Search Report and Written Opinion for International Application No. PCT/US2013/031285, International Filing Date Mar. 14, 2013, Report Completed Jun. 26, 2013, Mailed Jun. 26, 2013, 9 pages.

(Continued)

*Primary Examiner* — Jeremy C Norris
*Assistant Examiner* — Nathan Milakovich
(74) *Attorney, Agent, or Firm* — KPPB LLP

(57) ABSTRACT

Systems and methods in accordance with embodiments of the invention implement micro- and nanoscale capacitors that incorporate a conductive element that conforms to the shape of an array elongated bodies. In one embodiment, a capacitor that incorporates a conductive element that conforms to the shape of an array of elongated bodies includes: a first conductive element that conforms to the shape of an array of elongated bodies; a second conductive element that conforms to the shape of an array of elongated bodies; and a dielectric material disposed in between the first conductive element and the second conductive element, and thereby physically separates them.

21 Claims, 14 Drawing Sheets

(51) Int. Cl.
    *H01G 4/012*     (2006.01)
    *H01G 4/30*      (2006.01)
    *H01G 4/33*      (2006.01)
    *H01G 4/232*     (2006.01)
    *B82Y 10/00*     (2011.01)
    *H01L 49/02*     (2006.01)
    *H01G 4/38*      (2006.01)

(52) U.S. Cl.
    CPC . *H01G 4/30* (2013.01); *H01G 4/33* (2013.01); *H01G 4/38* (2013.01); *H01L 28/60* (2013.01); *H01L 28/86* (2013.01); *H01L 28/90* (2013.01)

(56) References Cited

U.S. PATENT DOCUMENTS

| | | | |
|---|---|---|---|
| 6,917,513 | B1 | 7/2005 | Kim et al. |
| 7,990,676 | B2 * | 8/2011 | Topaloglu ............... 361/303 |
| 8,760,851 | B2 | 6/2014 | Signorelli et al. |
| 8,796,932 | B2 | 8/2014 | Manohara et al. |
| 8,860,114 | B2 * | 10/2014 | Yen et al. ............... 257/306 |
| 8,916,919 | B2 * | 12/2014 | Thompson .......... H01L 23/5223 257/307 |
| 9,119,289 | B2 * | 8/2015 | Kelley ............... H05K 3/0014 |
| 9,250,148 | B2 | 2/2016 | Manohara et al. |
| 2002/0047154 | A1 * | 4/2002 | Sowlati ............... H01L 27/0688 257/307 |
| 2003/0036244 | A1 | 2/2003 | Jones et al. |
| 2004/0174655 | A1 | 9/2004 | Tsai et al. |
| 2008/0061700 | A1 | 3/2008 | Blick |
| 2008/0180883 | A1 | 7/2008 | Palusinski et al. |
| 2008/0285208 | A1 | 11/2008 | Sung et al. |
| 2009/0225490 | A1 * | 9/2009 | Liao et al. ............. 361/301.4 |
| 2009/0290280 | A1 | 11/2009 | Takeuchi et al. |
| 2010/0009511 | A1 | 1/2010 | Quinlan et al. |
| 2010/0020468 | A1 * | 1/2010 | Tan et al. ............... 361/311 |
| 2010/0028074 | A1 * | 2/2010 | Etling ............... 403/24 |
| 2010/0085672 | A1 | 4/2010 | Savin et al. |
| 2010/0177461 | A1 * | 7/2010 | Tuncer ............... 361/321.1 |
| 2010/0233523 | A1 | 9/2010 | Jo et al. |
| 2010/0264032 | A1 | 10/2010 | Bazant |
| 2010/0284125 | A1 | 11/2010 | Moon |
| 2010/0308435 | A1 | 12/2010 | Nowak et al. |
| 2011/0049674 | A1 * | 3/2011 | Booth et al. ............. 257/532 |
| 2012/0017408 | A1 * | 1/2012 | Masuda et al. ............. 29/25.41 |
| 2012/0044613 | A1 | 2/2012 | Cho et al. |
| 2012/0154979 | A1 | 6/2012 | Signorelli et al. |
| 2012/0225358 | A1 | 9/2012 | Seo et al. |
| 2013/0247678 | A1 | 9/2013 | Manohara et al. |
| 2013/0249598 | A1 | 9/2013 | Manohara et al. |
| 2013/0342953 | A1 * | 12/2013 | Subramanyam ............. 361/277 |
| 2013/0342962 | A1 | 12/2013 | Fletcher et al. |
| 2014/0029161 | A1 * | 1/2014 | Beidaghi et al. ............. 361/502 |
| 2014/0184364 | A1 | 7/2014 | McMillon et al. |
| 2014/0362495 | A1 | 12/2014 | Brandon et al. |
| 2015/0048482 | A1 * | 2/2015 | Shih ............... H01L 23/5223 257/532 |

FOREIGN PATENT DOCUMENTS

| | | |
|---|---|---|
| JP | 2012186452 A | 9/2012 |
| WO | 2013142246 A1 | 9/2013 |
| WO | 2013142246 A8 | 10/2014 |
| WO | 2014201051 A1 | 12/2014 |

OTHER PUBLICATIONS

International Search Report and Written Opinion for International Application No. PCT/US2014/041792, International Filing Date Jun. 10, 2014, Report Completed Sep. 24, 2014, Mailed Sep. 26, 2014, 8 pages.

International Preliminary Report on Patentability for International Application No. PCT/US2013/031285, International Filing Date Mar. 14, 2013, Report Completed Sep. 23, 2014, 7 pages.

Galinski et al., "Ionic liquids as electrolytes", Electrochimica Acta 51, 2006, pp. 5567-5580.

Kroon et al., "Quantum chemical aided prediction of the thermal decomposition mechanisms and temperatures of ionic liquids", Thermochimica Acta 465, 2007, pp. 40-47.

Sato et al., "Electrochemical properties of novel ionic liquids for electric double layer capacitor applications", Electrochimica Acta 49, 2004, pp. 3606-3611.

Sidelecka et al., "Stability of Ionic Liquids in Application Conditions", Current Organic Chemistry, 2011, vol. 15, pp. 1974-1991.

Watson et al., "High-Temperature Electronics Pose Design and Reliability Challenges", Analog Dialogue 46-04, Apr. 2012, pp. 1-7.

Ghosh et al., "Nanodiamond lateral field emission vacuum logic OR gate", Electronics Letters, Aug. 4, 2011, vol. 47, No. 16, 2 pgs.

Manohara, et al., "Carbon Nanotube-Based Digital Vacuum Electronics and Miniature Instrumentation for Space Exploration", Proc. of SPIE vol. 7594, 75940Q-1, Apr. 13, 2010.

Manohara, et al., "Carbon Nanotube-Based High Temperature Vacuum Microelectronics for E&P Applications", SPE 156947, Jun. 12, 2012.

Manohara et al., "11.2: "Digital" Vacuum Microelectronics: Carbon Nanotube-Gased Inverse Majority Gates for High Temperature Applications", IEEE, 2010, pp. 203-204.

Nusil Silicone Technology LLC, "Conductive Silicones in Elevated Temperatures", 5 pgs, May 2012.

Sergent, "Discrete Passive Components for Hybrid Circuits, Chapter 8, 40 pgs," 1995.

Wacker, "High-Performance Silicones for Transmission and Distribution", 52 pgs, 2012.

Zhang et al., "Lateral vacuum microelectronic logic gate design", J. Micromech. Microeng., 1991, pp. 126-134.

Chen, B. X. et al., "Approximate Calculating Methods Concerning the Electron Transit Time for a Vacuum Microelectronics Triode," J. Phys. D: Appl. Phys 33 (2000) L39-L43, Nov. 24, 1999.

International Search Report and Written Opinion for International Application PCT/US2013/031285, completed Jun. 26, 2013, 9 pgs.

Grzybowski et al., "High Temperature Performance of Polymer Film Capacitors", Journal of Microelectronic Packaging, 1998, vol. 1, pp. 711-716.

European Search Report for Application No. 13764392, Search completed Oct. 28, 2015, Mailed Nov. 9, 2015, 1 Pg.

International Preliminary Report on Patentability for International Application No. PCT/US2014/041792, Report issued Dec. 15, 2015, Mailed Dec. 23, 2015, 6 Pgs.

Invitation to Respond to Written Opinion for Singapore Application 11201404773Y, Report dated May 22, 2015, Mailed Jun. 18, 2015, 6 Pgs.

\* cited by examiner

MICRO- AND NANOSCALE CAPACITORS THAT INCORPORATE AN ARRAY OF CONDUCTIVE ELEMENTS HAVING ELONGATED BODIES

CROSS-REFERENCE TO RELATED APPLICATIONS

The current application claims priority to U.S. Provisional Application No. 61/614,128, filed Mar. 22, 2012, the disclosure of which is incorporated herein by reference.

STATEMENT OF FEDERAL FUNDING

The invention described herein was made in the performance of work under a NASA contract, and is subject to the provisions of Public Law 96-517 (35 U.S.C. 202) in which the Contractor has elected to retain title.

FIELD OF THE INVENTION

The present invention generally relates to capacitors.

BACKGROUND

Capacitors are devices that can store electric charge, and typically consist of two conducting objects placed near each other but not touching. Capacitors are widely used in electronic circuits. For example, they can be used to store charge for later use, as in a camera flash, or alternatively as energy backup in case of a power failure. Capacitors can also be used to: block surges of charge and energy to protect circuits; form parts of a radio; and serve as memory for binary code in random access memory (RAM). A capacitor stores charge in proportion to an applied voltage, and in proportion to its capacitance, which is an inherent property of the capacitor. Accordingly, it would be useful to develop capacitors that have a greater capacitance, so that the capacitor can store more charge.

SUMMARY OF THE INVENTION

Systems and methods in accordance with embodiments of the invention implement micro- and nanoscale capacitors that incorporate a conductive element that conforms to the shape of an array elongated bodies. In one embodiment, a capacitor that incorporates a conductive element that conforms to the shape of an array of elongated bodies includes: a first conductive element that conforms to the shape of an array of elongated bodies; a second conductive element that conforms to the shape of an array of elongated bodies; and a dielectric material disposed in between the first conductive element and the second conductive element, and thereby physically separates them.

In another embodiment, the first conductive element and the second conductive element are distinct structures that are configured to interdigitate, but not physically contact one another.

In a further embodiment, the inter-electrode gap is less than approximately 10 μm.

In yet another embodiment, the first conductive element and the second conductive element each conform to the shape of an array of cylinders.

In a yet further embodiment, the first conductive element and the second conductive element each conform to the shape of an array of hexagonal elongated bodies.

In still another embodiment, the first conductive element and the second conductive element each constitute an array of elongated bodies.

In a still further embodiment, the first conductive element and the second conductive element each constitute a coating deposited onto an array of elongated bodies.

In still yet another further embodiment, the dielectric material is Polybenzimidazole.

In a still yet further embodiment the dielectric material is a Celazole ® Polybenzimidazole material.

In another embodiment, the first conductive element is a layer disposed onto an array of elongated bodies; the dielectric material is a layer that is disposed onto the first conductive element; and the second conductive element is a layer that is disposed onto the dielectric material.

In a further embodiment, the array of elongated bodies includes conductive silicon.

In still another embodiment, the array of elongated bodies includes a layer of dielectric material disposed onto the conductive silicon.

In a still further embodiment, the first conductive element and the second conductive element each comprise TiN.

In yet another embodiment, the dielectric material includes $Al_2O_3$.

In a yet further embodiment, the array of elongated bodies comprises carbon nanotubes.

In still yet another embodiment, the array of elongated bodies includes a silicon oxide layered onto the carbon nanotubes.

In a still yet further embodiment, the first conductive element and the second conductive element each include TiN.

In another embodiment, the dielectric material comprises $Al_2O_3$.

In a further embodiment, the capacitor includes: a second dielectric material; a third conductive element; a third dielectric material; a fourth conductive element; a fourth dielectric material; and a fifth conductive element; where: the second dielectric material is a layer disposed onto the second conductive element; the third conductive element is a layer that is disposed onto the second dielectric material; the third dielectric material is a layer disposed onto the third conductive element; the fourth conductive element is a layer that is disposed onto the third dielectric material; the fourth dielectric material is a layer that is disposed on the fourth conductive element; and the fifth conductive element is a layer that is disposed onto the fourth dielectric material.

In yet another embodiment, the dielectric material is $BaTiO_3$.

In a yet further embodiment, the first conductive element, the second conductive element, and the dielectric material have similar coefficients of thermal expansion.

In still another embodiment, the first conductive element, the second conductive element, and the dielectric material allow the capacitor to operate at within a temperature range from approximately 20° C. to 360° C.

DETAILED DESCRIPTION

Turning now to the drawings, systems and methods for implementing micro- and nano-scale capacitors that incorporate a conductive element that conforms to the shape of an array elongated bodies are described. The capacitance of a capacitor is generally a function of the surface area of the conductive elements and the distance of their separation. In general, the capacitance increases with an increase in surface area, and decreases with an increase in the separation distance. For example, the capacitance of parallel plate capacitors, i.e. two parallel conductive plates separated by a distance in a vacuum, can be determined using the relationship, $$C=(\epsilon_0 * A)/d$$

where:
C is the capacitance;
$\epsilon_0$ is the permittivity of free space;
A is the surface area of the plate; and
d is the is the distance that separates the plate.

Similarly, the capacitance of a cylindrical capacitor, i.e. a rod centrally disposed within, and parallel to, a cylindrical tube (separated by a vacuum) is $$C=(2\pi\epsilon_0 L)/ln(R_a/R_b)$$

where:
L is the length of the rod and cylindrical tube;
$R_a$ is the radius of the inner surface of the tube; and
$R_b$ is the radius of the rod.

Also similarly, the capacitance of a spherical capacitor, i.e. a first spherical shell centrally disposed within a second spherical shell (separated by a vacuum), can be determined in accordance with the relationship, $$C=4\pi\epsilon_0(r_a r_b/(r_b-r_a))$$

where:
$r_a$ is the radius of the first spherical shell; and
$r_b$ is the radius of the second spherical shell.

Of course, the capacitances of a capacitor can be increased by using a dielectric material to separate the conductive elements, as opposed to a vacuum. In these cases, the capacitance will be increased in proportion to a dielectric constant, K, which is a function of the dielectric material. Some dielectric materials and their dielectric constants are presented below in Table 1:

TABLE 1

Examples of Dielectric Materials and their Dielectric Constants

| Material | K |
| --- | --- |
| Vacuum | 1 |
| Air | 1.004 |
| Most Polymers | 2-6 |
| Highest Polymers | 16 |
| Celazole ® PBI (Polybenzimidazole) | 3.2 |
| Most Ceramics | 4-12 |
| $Al_2O_3$ | 9 |
| $Ta_2O_5$ | 25 |
| $TiO_2$ | 90 |
| $BaTiO_3$ | 1500 |
| $SiO_x$ | 3.9 |
| Ceramic Formulation Based | 20-15,000 |

The data in table 1 is drawn from J. E. Sergent, "Chapter 8: Discrete Passive Components for Hybrid Circuits," in *Hybrid Microelectronics Handbook*, Second Edition, J. E. Sergent and C. A. Harper, eds., McGraw-Hill, Inc., New York, 1995, pp. 8-1 to 8-40, the disclosure of which is hereby incorporated by reference.

Figure 1A:
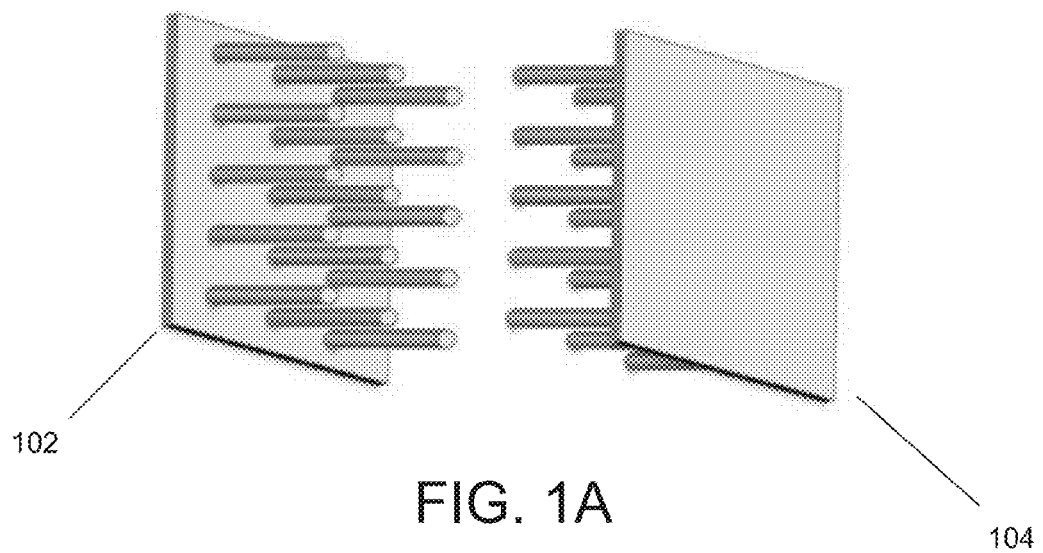
FIGS. 1A and 1B illustrate a capacitor that includes two conductive elements that each conform to the shape of an array of elongated bodies, and that are each distinct structures and that are configured to interdigitate in accordance with embodiments of the invention.
Figure 1B:
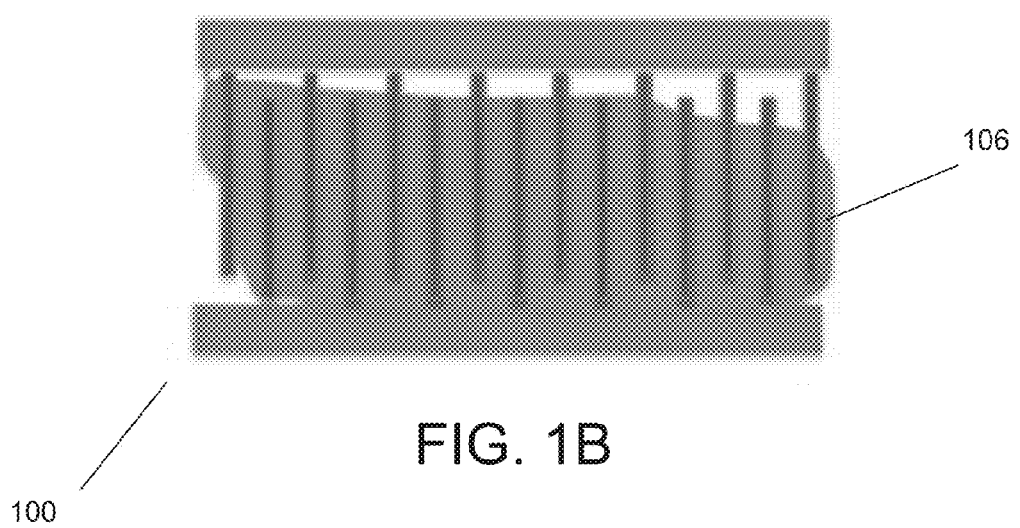

In essence, the capacitance of a capacitor can be increased by increasing the surface area of the conductive elements, decreasing the separation distance between the conductive elements, and using an appropriate dielectric material. Accordingly, in many embodiments of the invention, a capacitor incorporates a conductive element that conforms to the shape of an array of elongated bodies. In this way, the surface area of the conductive element can be substantially increased. In many embodiments, a capacitor includes: a first conductive element that conforms to the shape of an array of elongated bodies, a second conductive element that conforms to a shape of an array of elongated bodies, and a dielectric material disposed in between the first conductive element and the second conductive element, and thereby physically separates them. In some embodiments, the first conductive element and second conductive element are each distinct structures that are configured to interdigitate, but not physically contact one another. FIGS. 1A and 1B illustrate a capacitor that includes two conductive elements that are each distinct structures and that are configured to interdigitate, but not physically contact one another in accordance with an embodiment of the invention. In particular, a capacitor 100 includes a first conductive element 102 and a second conductive element 104 that are separated by a dielectric material 106. FIG. 1B illustrates how the conductive elements can interdigitate.

In a number of embodiments, a first conductive element conforms to the shape of an array of electrode bodies, a dielectric material is layered onto the first conductive element, and a second conductive element is layered onto the dielectric material. In these ways, the surface area of the two conductive elements can be increased, and the distance separating them can be decreased—accordingly, the capacitance can be increased.

It may also be desirable to develop capacitors that can withstand high temperature operation. Thus, in a number of embodiments, the capacitor implements combinations of conductive elements and dielectric materials that allow it to be high-temperature compatible. For example, the dielectric constants for dielectric materials can vary with temperature. Hence, a dielectric material can be selected/developed that has a relatively high dielectric constant, even at high temperature. Similarly, in developing a capacitor that can withstand high-temperature operation, the constituent components can be selected so that they are compatible and can function cohesively (e.g., they have compatible coefficients of thermal expansion).

A discussion of capacitors that implement two distinct conductive elements that conform to the shape of an array elongated bodies and interdigitate now follows.

Capacitors that Incorporate Two Conductive Elements that Conform to the Shape of an Array of Elongated Bodies and Interdigitate As alluded to above, in many embodiments, a capacitor includes a first conductive element that conforms to the shape of an array of elongated bodies, and a second conductive element that conforms to the shape of an array of elongated bodies, where the first and second conductive elements are configured to interdigitate, but not physically contact. In this way, the surface area between the two conductive elements that make up the capacitor can be substantially increased, and the distance between them can be reduced. Thus, the capacitance can be increased. Referring back to FIGS. 1A and 1B, it is illustrated how a first conductive element and a second conductive element that conform to the shape of an array of elongated bodies can interdigtate to form a capacitor. In the illustrated embodiment, the first conductive element 102 and the second conductive element 104 take the form of an array of cylindrical bodies. Accordingly, the first conductive element 102 and the second conductive element 104 can be configured to interdigitate, or mesh, to form the capacitor 100. A dielectric material 106 can be interjected between the first conductive element 102 and the second conductive element 104 to enhance the capacitance. Of course, the two conductive elements operate as the capacitors electrodes.

Figure 2:
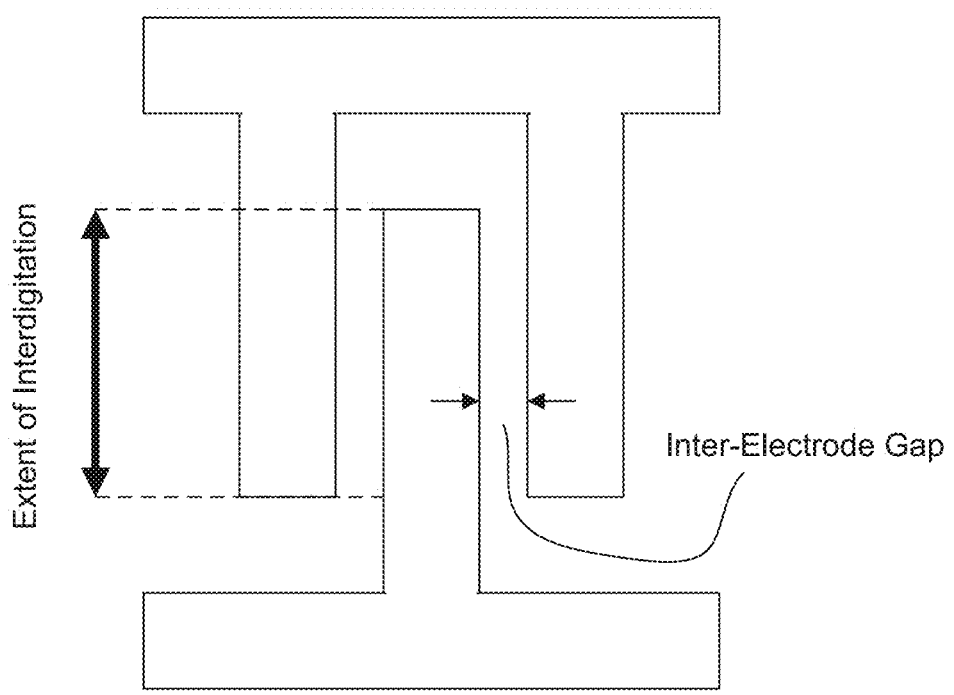
FIG. 2 depicts parameters that can be used to characterize the spatial relationship of two conductive elements that are configured to interdigitate.
Figure 3:
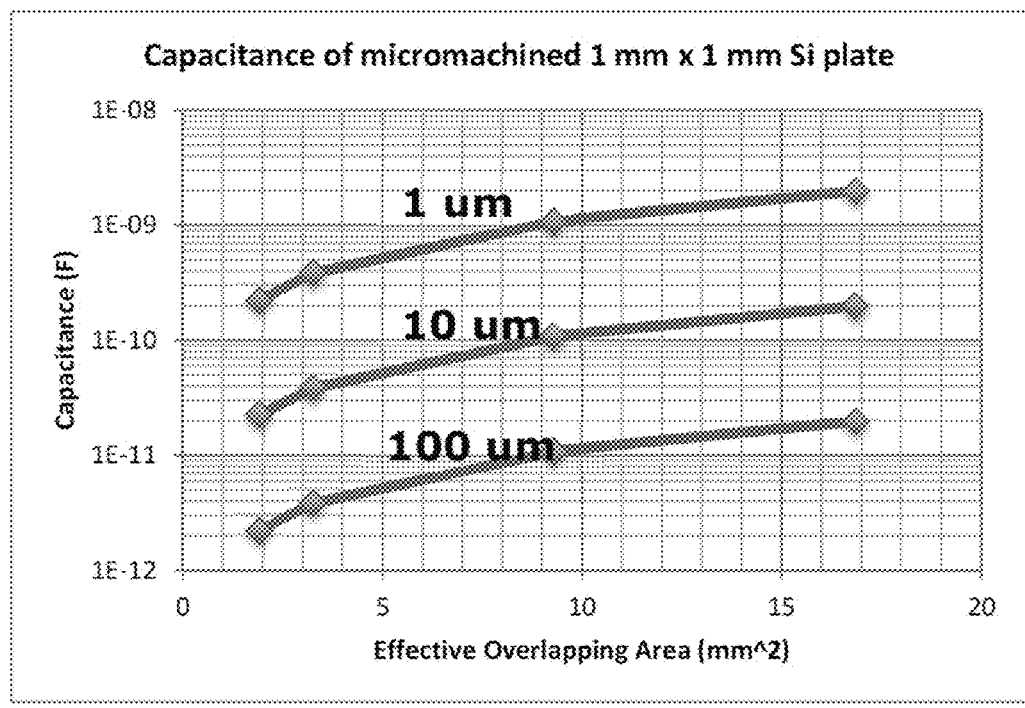
FIG. 3 depicts the expected capacitance of two conductive elements that are configured to interdigitate as a function of their spatial relationship in accordance with embodiments of the invention.

FIG. 2 depicts some parameters that can characterize the spatial relationship between the first conductive element and the second conductive element, and can thereby characterize the capacitance. For example, the inter-electrode gap and the extent of interdigitation are depicted. Note that the extent of interdigitation corresponds with the overlapping area between the conductive elements. Again, capacitance generally increases with a greater overlapping surface area and a lesser inter-electrode distance. FIG. 3 depicts a graph illustrating the expected capacitance as a function of overlapping area for 3 different inter-electrode configurations—1 μm, 10 μm, and 100 μm for a micromachined 1 mm×1 mm Si plate. Note that the greatest capacitance is where the inter-electrode distance is smallest, and the effective overlapping area is greatest. Although in implementing a particular spatial relationship between two conductive elements, there may be other factors to consider. For instance, the ability to increase capacitance by reducing thickness may be limited by the breakdown voltage of the dielectric material and also the manufacturing process. Accordingly, in many embodiments, a distance between the first and second conductive elements is maintained such that the dielectric material will not experience a potential difference that approximates its breakdown voltage.

Figure 4:
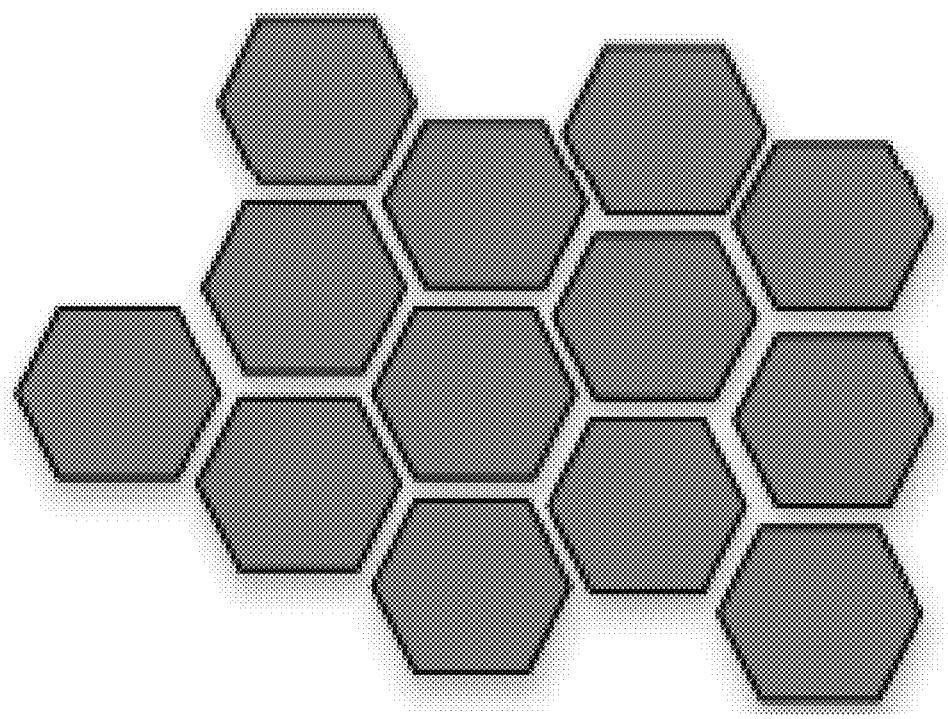
FIG. 4 depicts a honeycomb structure that the elongated bodies can take the form of in accordance with embodiments of the invention.

Although cylindrical elements have been depicted, of course any elongated bodies may be used in accordance with embodiments. For instance, elongated bodies that have a hexagonal cross-section may be used. FIG. 4 depicts a "honeycomb" arrangement where the elongated bodies have a hexagonal cross-section that can be used in accordance with an embodiment of the invention. A honey comb arrangement may be advantageous insofar as a constant inter-electrode distance between the conductive elements can be maintained. Similarly, elongated bodies that have a square-shaped cross-section ('posts') can be used in accordance with embodiments. Although elongated bodies that have a constant cross-section through their length have been depicted, it is not requisite that the elongated bodies have a constant cross-section throughout their length—they can taper. Generally, any elongated bodies may be used to increase surface area in accordance with embodiments of the invention.

Figure 5:
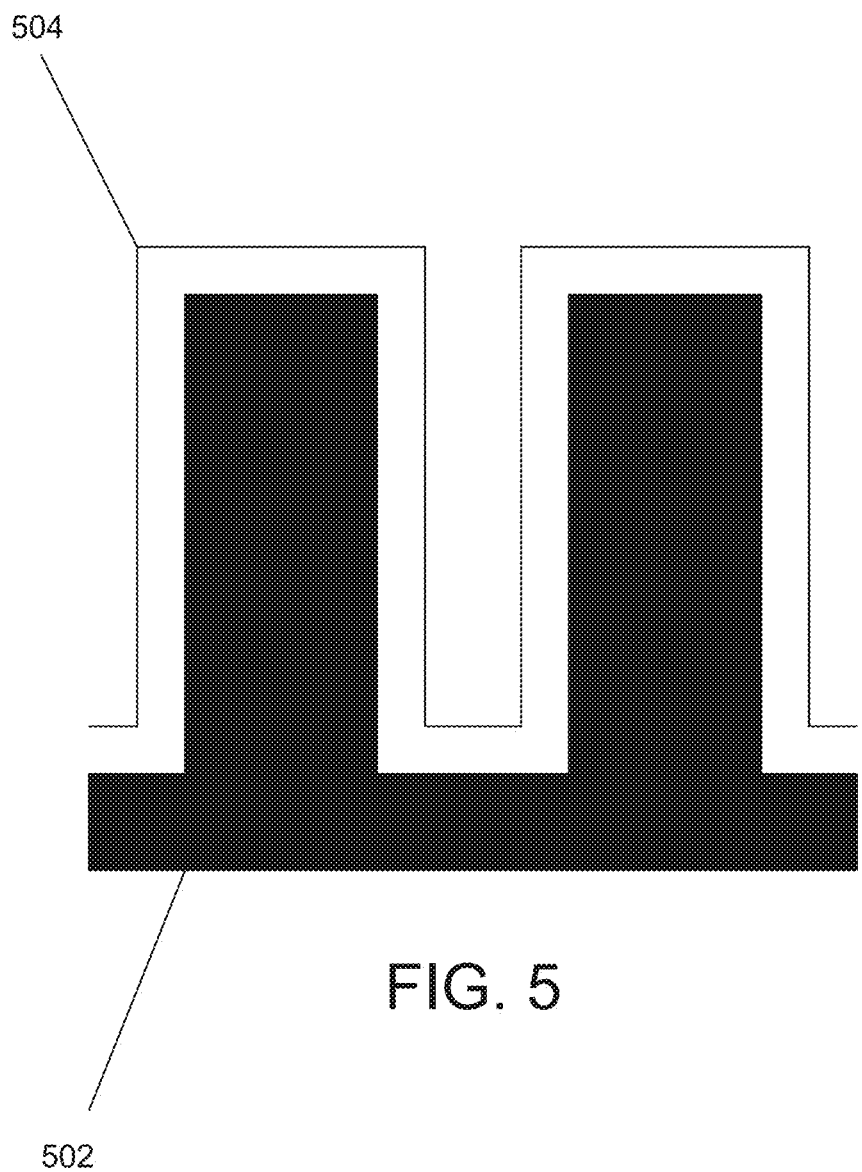
FIG. 5 depicts how a conductive element that conforms to the shape of an array of elongated bodies can be achieved by coating an array of elongated bodies in accordance with embodiments of the invention.

Moreover, although conductive elements that constitute solid elongated bodies have been discussed, conductive elements that do not constitute solid elongated bodies can also be used in accordance with embodiments of the invention. For instance, in some embodiments, a conductive element is coated onto a template array of elongated bodies. It can thereby be said that this conductive element conforms to the shape of an array of elongated bodies. Of course, it is the shape of the body of the conductive element that is relevant, irrespective of array of elongated bodies—the array of elongated bodies merely defines the shape with the increased surface area. FIG. 5 illustrates a conductive element 504 that is coated onto a template array of elongated bodies 502. In general, the surface area of the conductive element can be increased so as to approximate the shape of an array of elongated bodies in any manner in accordance with embodiments of the invention.

Any dielectric can be used in accordance with embodiments of the invention, including, but not limited to, those listed in Table 1. For example Celazole ® PBI (Polybenzimidazole), manufactured by PBI Performance Products, Inc. For instance, a Celazole ® PBI (Polybenzimidazole) with the properties listed in Table 2 may be used.

TABLE 2

Properties of a Celazole Material that Can Be Used as a Dielectric Material

| Property | ASTM Test Method | Units | Celazole ® PBI |
|---|---|---|---|
| Physical | | | |
| Specific Gravity | D792 | | 1.3 |
| Mechanical | | | |
| Tensile Strength | D638 | psi | 20,000 |
| Tensile Modulus | D638 | psi | 850,000 |
| Flexural Strength | D790 | psi | 32,000 |
| Flexural Modulus | D790 | psi | 950,000 |
| Compressive Strength | D695, 10% Def. | psi | 50,000 |
| Compressive Modulus | D695 | psi | 900,000 |
| Thermal | | | |
| Coefficient of Thermal Expansion | E831 (TMA) | 10E–4/° F. | 0.13 |
| Deflection Temperature, 264 psi | D648 | ° F. | 800 |
| Tg-Glass Transition (Amorphous) | D3418 | ° F. | 750 |
| Continuous Service in Air (Max) Without Load | | ° F. | 600 |
| Thermal Conductivity | | BTU-in/ hr-ft$^2$-° F. | 2.8 |
| Electrical | | | |
| Dielectric Strength, Short Term | D149 (2) | Volts/mil | 550 |
| Surface Resistance | Lower Limit; EOS/ESD S11.11 | Ohm/Square | 1E+13 |

TABLE 2-continued

Properties of a Celazole Material that Can Be Used as a Dielectric Material

| Property | ASTM Test Method | Units | Celazole ® PBI |
|---|---|---|---|
| Dielectric Constant, 1 MHz | D150 (2) | | 3.2 |
| Dissipation Factor, 1 MHz | D150 (2) | | 0.003 |

Of course, any suitable polybenzimidazole-based material can be used. For example, any of the following, produced by PBI Performance Products, Inc., may be used: Celazole U-60, Celazole U-60SD, Celazole U-60ESD, Celazole TU-60, Celazole TF-60C, Celazole TF-60B, Celazole TL-60. Using Celezole®-based materials as the dielectric material can be advantageous because of an ability to function at high temperatures. Although Celazole® has been referenced, many other polybenzimidazole-based materials can be used as dielectrics in accordance with embodiments of the invention. Indeed, any suitable high-temperature tolerant polymer can be used. More generally, any suitable dielectric material (including air or a vacuum) can be used in accordance with embodiments of the invention.

As suggested above, capacitors can also utilize layered coatings of conductive elements and dielectric materials that conform to the shape of an array of elongated bodies, and this is discussed in greater detail below.

Figure 6:
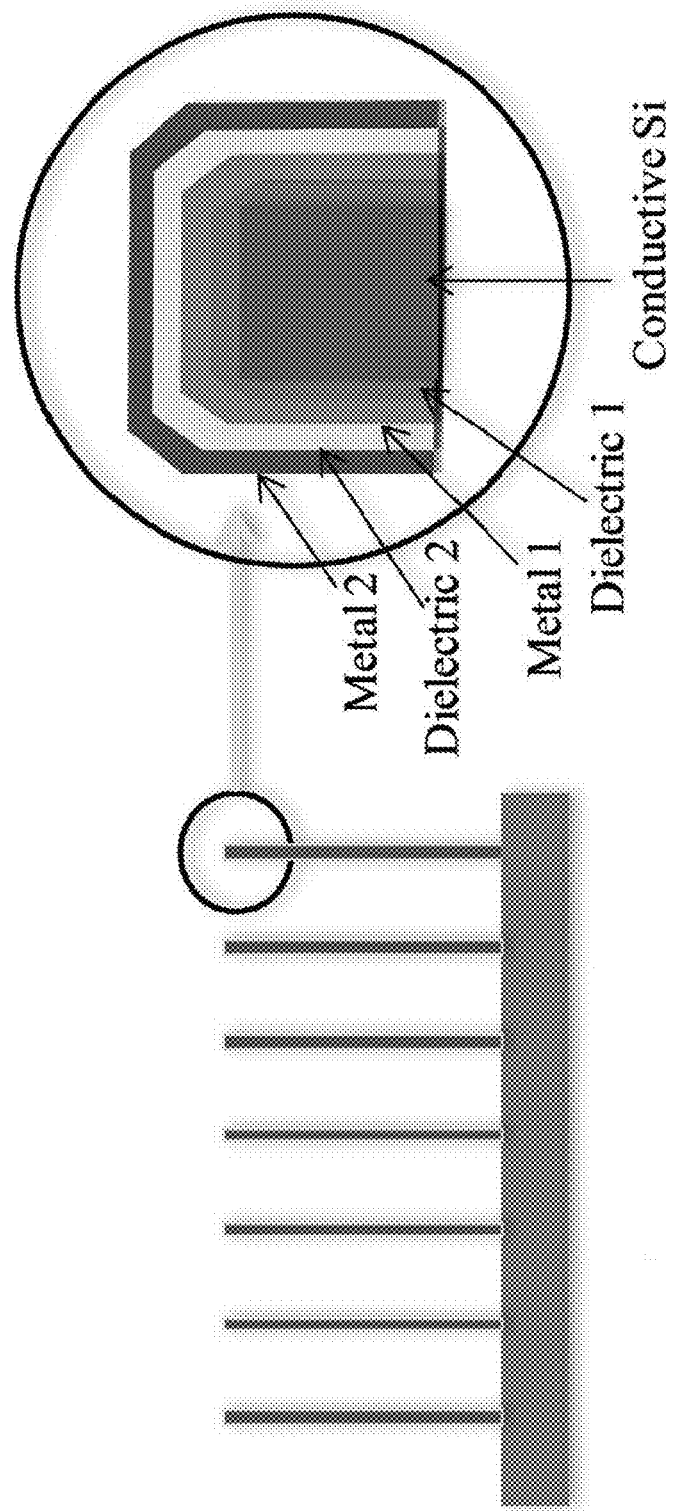
FIG. 6 illustrates a micro-scale capacitor that incorporates layers of conductive material and dielectric materials in accordance with embodiments of the invention.

Capacitors that Incorporate Layers of Conductive Elements and Dielectric Materials In many embodiments, capacitors incorporate layers of conductive elements and layers of dielectric materials so as to achieve a capacitor. When layers of conductive materials and layers of dielectric materials that take the form of elongated bodies are used, a capacitor can be achieved with a high surface area using a single discrete structure. FIG. 6 illustrates a microscale capacitor that implements layers of conductive elements and layers of dielectric material. In particular, the capacitor includes a conductive silicon elongated body, a first dielectric, a first metal that is a conductive element, a second dielectric, and a second metal that is a conductive element. In particular, the first dielectric is layered onto the conductive silicon elongated body; the first metal that is a conductive element is layered onto the first dielectric; the second dielectric is layered onto the first metal that is a conductive element; and the second metal that is a conductive element is layered onto the second dielectric. Again, the two metals can act as electrodes.

In some embodiments, an array of elongated bodies itself can act as an electrode, e.g., a layer of dielectric material can be deposited on an array of elongated bodies that acts as a first electrode, and a layer of material that is a conductive element and that can act as the second electrode can be deposited on the layer of dielectric material.

Figure 7:
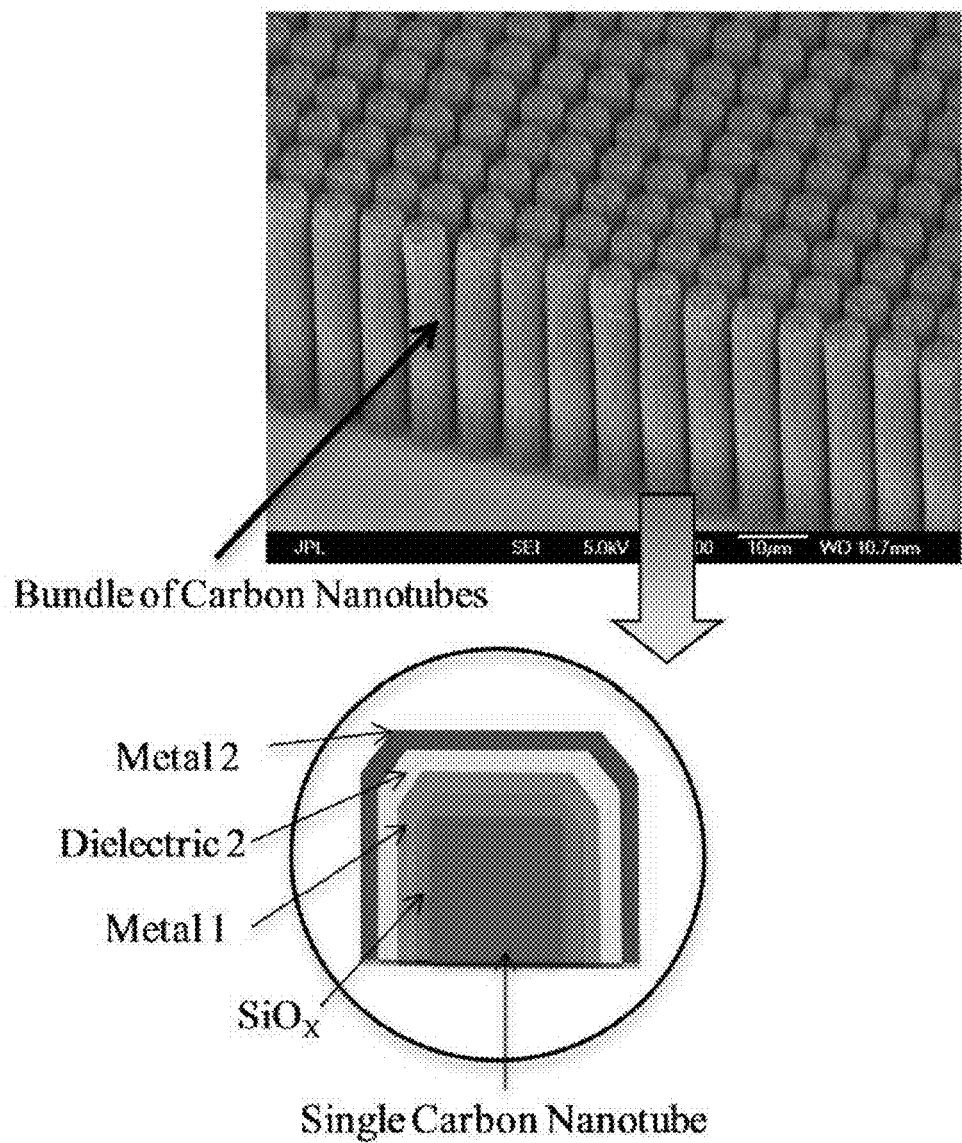
FIG. 7 illustrates a nanoscale capacitor that incorporates layers of conductive material and dielectric material in accordance with embodiments of the invention.

FIG. 7 illustrates a nanoscale capacitor that implements layers of conductive elements and layers of dielectric materials. In the illustrated embodiment, a silicon oxide dielectric is layered onto a single carbon nanotube; a first metal that is a conductive element is layered onto the silicon oxide; a second dielectric is layered onto the first metal that is a conductive element; and a second metal that is layered onto the second dielectric. Of course, the two metals can act as electrodes for the capacitor. Atomic layer deposition (ALD) can be used to conformally layer the coatings. Note that any suitable conductive element and any suitable dielectric material can be so-layered in accordance with embodiments of the invention. For instance, in a number of embodiments, a TiN is used as the conductive elements. In several embodiments, $Al_2O_3$ is used as a dielectric material. In a number of embodiments, the materials are selected so that the capacitor can maintain its functionality from room temperature up to at least approximately 360° C. Of course, any suitable materials—including, but not limited to, the materials listed in Table 1—can be used in accordance with embodiments of the invention.

Advantageously, the layers of coatings of the conductive material and the dielectric material can be iterated so as to increase the surface area of the capacitor, and thereby increase capacitance. For example, a third dielectric material can be layered on top of the second conductive element, a third conductive element can be layered thereafter, and this pattern can be repeated. In effect, iterating this pattern basically results in multiple 'sub-capacitors' (i.e. any two conductive elements separated by a single dielectric material) that can be connected in parallel to form a single capacitor. In this way, the surface area of the capacitor can be substantially increased, and subsequently the capacitance can be substantially increased. Indeed, using multiple layers in this fashion can allow very high capacitances to be achieved. Of course, the layers of conductive materials, and of dielectric materials can each be different—any combination of materials can be used. For example, it is not necessary that the same conductive materials be used, nor is it necessary that the same dielectric materials be used. Moreover, as one of ordinary skill in the art would appreciate, any combination of the above-described techniques can be used to implement capacitors with greater surface area in accordance with embodiments of the invention.

Figure 8A:
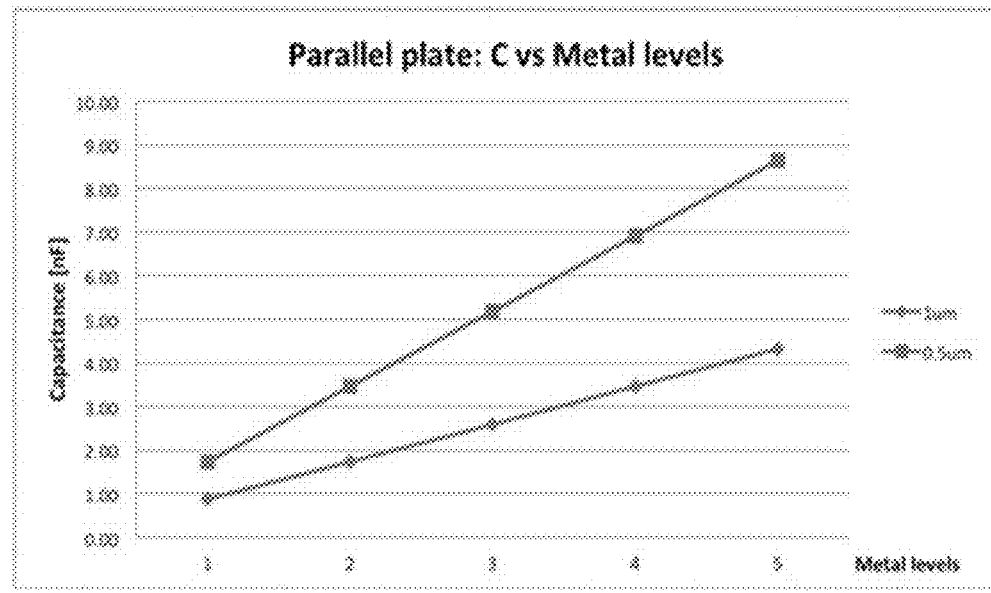
FIGS. 8A-8E illustrate how the expected capacitance can vary as a function of the geometry of the capacitance.
Figure 8B:
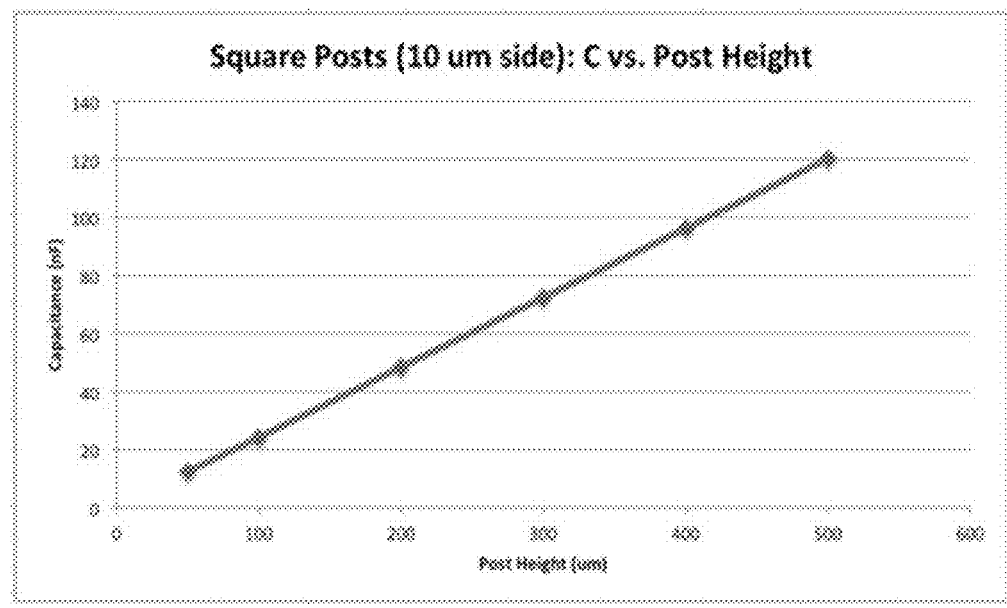
Figure 8C:
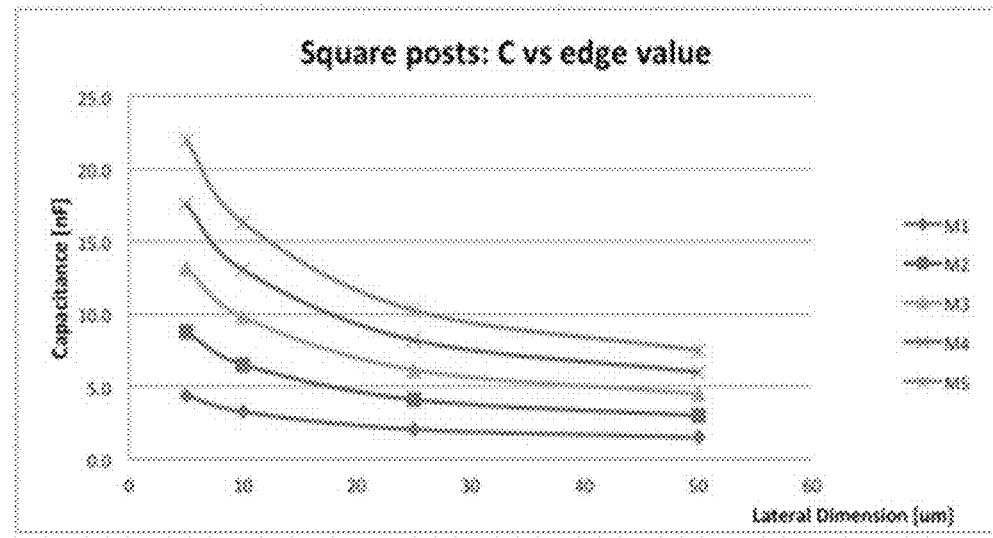
Figure 8D:
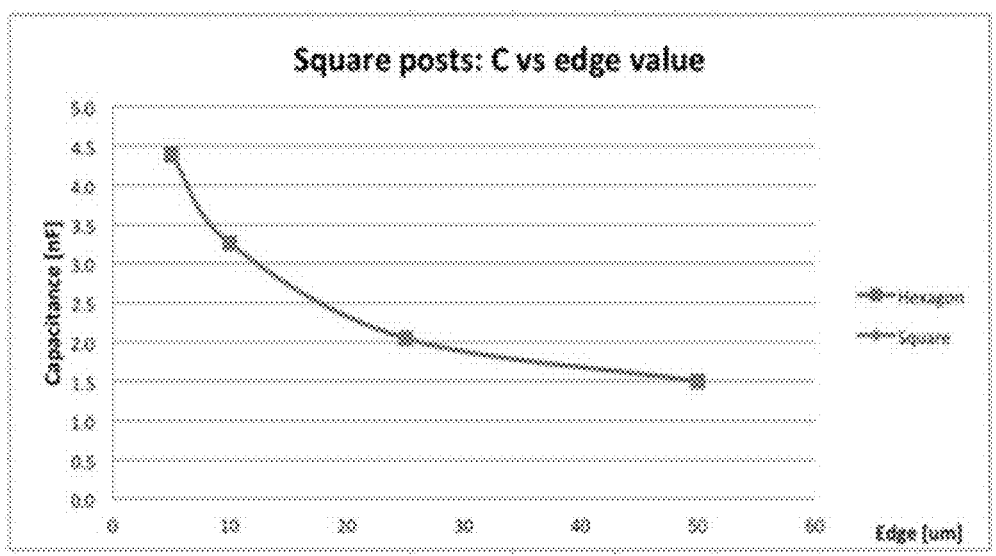
Figure 8E:
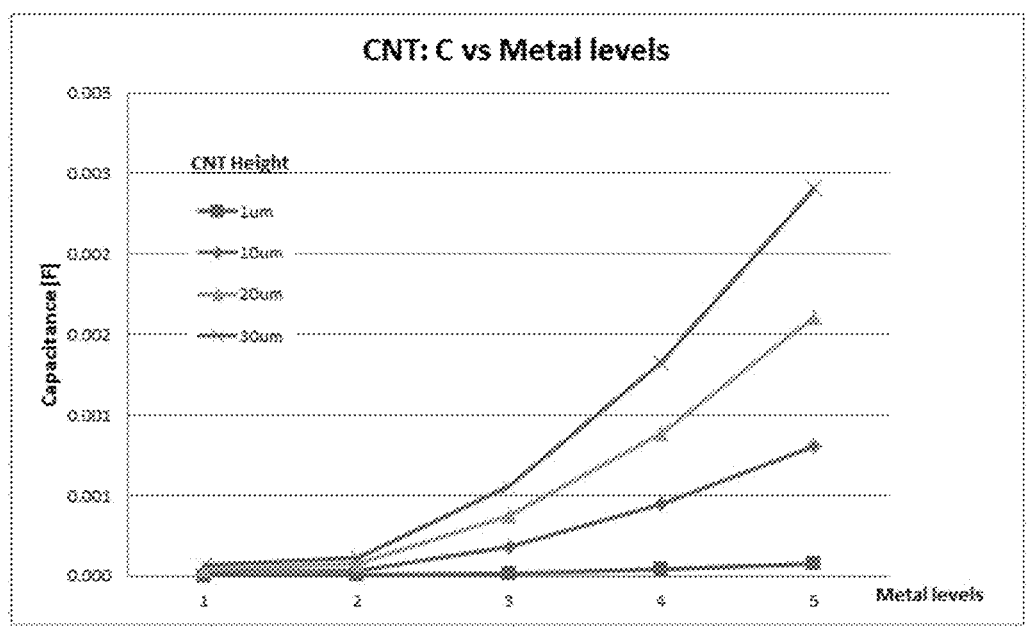

FIGS. 8A-8E illustrate how the capacitance of capacitors can be expected to vary as a function of the geometry of the conductive elements. FIG. 8A depicts the capacitance of standard parallel plate capacitors. Note that as more metallic layers are incorporated, the capacitance increases proportionally. FIG. 8B depicts how when square 'posts' are used (the posts having a lateral dimension of 10 μm and have 2 μm spacing), the capacitance increases in proportion to the height of the post. This is because when the posts are taller, the surface area increases. FIG. 8C shows that when a capacitor of a given footprint uses square posts, as the lateral dimension of the square posts (i.e. the length of the side of the square of the post) decreases, the capacitance increases. This is because the posts can be more densely packed within the given footprint. FIG. 8D shows that the capacitance is not expected to be a function of whether the elongated bodies are hexagonally shaped or square shaped. Finally, FIG. 8E depicts the expected capacitances for a capacitor that layers conductive elements and dielectric materials onto carbon nanotubes. Note that the magnitude of the capacitance can be much greater when carbon nanotubes serve as a base for the capacitor.

Capacitors can also be developed to sustain high temperature operation, and this is now discussed.

Capacitors that can Operate at High Temperature

Capacitors that can sustain high temperature operation (e.g. 185° C.) can be implemented in accordance with embodiments of the invention. The constituent materials can be selected so that they are compatible with high temperature operation, e.g. the constituent materials are stable in their physical and electronic characteristics up to a specified high temperature. For example, many dielectric materials begin to degrade at higher temperatures, and this can lead to leakage, which can begin the breakdown of the capacitor. Materials that are formed at higher temperatures tend to be stable at the temperature of formation. Accordingly, in many embodiments, materials that are formed at high temperatures (e.g. greater than approximately 185° C.) are used as the constituent materials in developing the capacitor.

Figure 9:
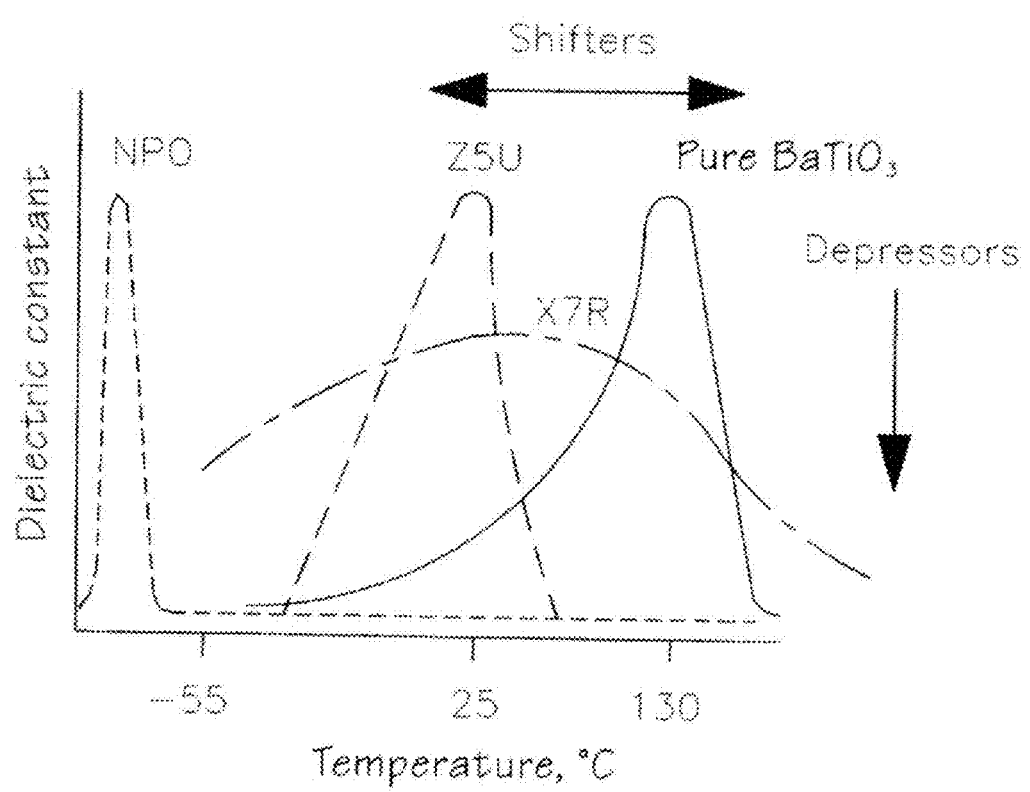
FIG. 9 illustrates how a dielectric constant can vary as a function of temperature, and how it can be manipulated.

Notably, the dielectric constant of different materials can vary as a function of temperature. For example, FIG. 9 illustrates how the dielectric constant of barium titanate along with some other formulations, vary as a function of temperature. Additionally, it is illustrated how shifters can be added to shift the peak temperature. For example, some shifters include other titanates and zirconates. FIG. 9 also depicts the influence that "depressors" can have on the dielectric constant, i.e. it can lower the dielectric constant. Some depressors include bismuth and magnesium. The data in FIG. 9 is drawn from J. E. Sergent, "Chapter 8: Discrete Passive Components for Hybrid Circuits," in Hybrid Microelectronics Handbook, Second Edition, J. E. Sergent and C. A. Harper, eds., McGraw-Hill, Inc., New York, 1995, pp. 8-1 to 8-40, the disclosure of which is hereby incorporated by reference. Accordingly, in many embodiments, a dielectric material is chosen that has a suitable dielectric constant, even at higher temperatures.

Additionally, in selecting a dielectric material, there are also other factors to consider aside from the dielectric constant. Table 3 below: lists some polymer dielectric materials (along with their commercial source) and some of their notable characteristics.

TABLE 3

Properties of polymer dielectric materials

| Dielectric Material | Commercial Source | Properties and Advantages |
|---|---|---|
| Polysilseqioxane | David Sarnoff Labs | Good electrical properties up to 250° C., superior to Kapton and Tefzel, can dip or spray coat |
| Teflon Perflouroalkoxy (PFA) | Dupont | Good mechanical and electrical properties to temperatures as high as 200° C. |
| Polyimide (PI) | Dupont | Small variations in dielectric loss to temperatures up to 200° C. |
| Nomex 410, 418 | Dupont | Aramid papers of synthetic aromatic polyamide polymer; chemically & thermally stable to >220° C.; radiation resistant; 418 grade contains 50% inorganic mica platelets and is designed for high voltage |
| Diflouro-PBZT Tetraflouro-PBZT | Foster-Miller | High temperature stability; low dielectric constant |
| PBO | Foster-Miller, Dow Chemical | Very high temperature stability, 300-350° C., significantly exceeding the performance of Kapton and Tefzel |
| PBO-flourinated IPN | Foster-Miller | High temperature stability combined w/resistance to flash over |
| Organo-ceramic hybrid nano composites | Garth Wilkes, VPI | Resistant to ionizing radiation; high thermal stability to greater than 200° C. |
| Polybenzimidazole-PBI | Hoechst Celanese | Linear thermoplastic polymer; excellent thermal stability and strength retention >300° C. |
| Flourinated PBO-PI | Hoechst Celanese | Combines possibility of polyimides with high temperature properties of LCPs |
| Flourinated polyimides | Hoechst Celanese Ube/ICI, Dupont | Readily available from Ube/ICI & Dupont; thermal stability exceeds Kapton and Tefzel |
| Voltex 450 | Lydall, Inc. | Paper composed of aramid fiber and neoprene binder; low water absorption and high dielectric strength; thermally stable >200° C. |
| Thermoplastic PBO with hexaflourinated moieties | Material lab, WRDC | Thermally processable; high temperature stability, $T_g > 380°$ C. |
| PQ-100 polyquinolines | Maxdem | Thermally processable; high purity |
| Polysiloxaneimides | McGrath, VPI | Resistant to ionizing radiation; high thermal stability |
| Poly-P-Xylene (PPX) | Nova Tran | Stable dielectric strength to temperatures as high as 250° C.; may lose some of its good mechanical properties when exposed for long periods to elevated temperature |
| Flourocarbon-hydrocarbon polymers | Tefzel, Dupont | Readily available; high quality films; moderate thermal stability |
| FPE Proprietary aromatic polyester | 3M | Readily available high quality aromatic films useful to 250° C. |

The data in table 3 is drawn from R. R. Gryzbowski and F. P. McCluskey, "High Temperature Performance of Polymer Film Capacitors," Journal of Microelectronic Packaging, Vol. 1, 1998, pp. 153-158, the disclosure of which is hereby incorporated by reference.

Any dielectric material may be used in accordance with embodiments of the invention, including, but not limited to, those listed in Table 3. In many embodiments, the dielectric material is one of: silicon dioxide, silicon nitride, high-temperature compatible Parylene, aluminum oxide (alumina), Celazole ®, Teflon (Polytetrafluoroethylene), polyimide, and barium titanate. These materials have demonstrated high temperature compatibility.

Similarly, any suitable conductive material can be used as the electrodes in accordance with embodiments of the invention. In many embodiments, the conductive material is one of: silicon, titanium, gold, tungsten, molybdenum, platinum.

In designing a capacitor that can sustain high temperature operation, the packaging of the capacitor also needs to be considered. For example, the capacitor may fail at high temperature because of a separation of the encapsulant due to lack of hermeticity or coefficient of thermal expansion mismatches. Additionally, the interaction of the various components of the capacitor needs to be considered. For example, tantalum capacitors exhibit diffusion of the oxide layer into the tantalum electrode resulting in a reduction in the thickness of the dielectric with a concomitant reduction in the breakdown voltage of the dielectric, which can result in thermal runaway and catastrophic failure of the capacitor during elevated temperature operation. Additionally, the size of brittle capacitors, such as the large, higher value ceramic capacitors are size limited due to the stresses generated within the capacitor resulting from coefficient of thermal expansion mismatches between the device and the substrate, which results in fracture of the capacitor during thermal cycling.

Accordingly, in many embodiments of the invention, the constituent materials of the capacitor are selected so that they cohesively cooperate with one another so as to achieve a capacitor capable of withstanding high temperatures during operation. In many embodiments, the constituent elements have similar coefficients of thermal expansion, such that they do not fail (e.g. via delamination) at high temperatures. In numerous embodiments, the constituent materials do not exhibit any mass transfer, e.g. via diffusion, at high temperature so that the geometry of the capacitor remains substantially the same (e.g., the thickness of the dielectric does not decrease). In a number of embodiments, the hermeticity of the encapsulant is sufficiently ensured.

Figure 10A:
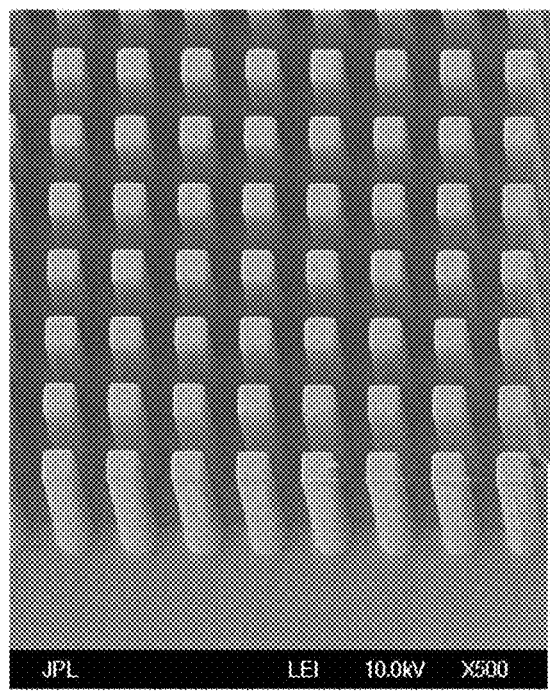
FIGS. 10A and 10B illustrate capacitors that can operate under high temperature conditions in accordance with embodiments of the invention.
Figure 10B:
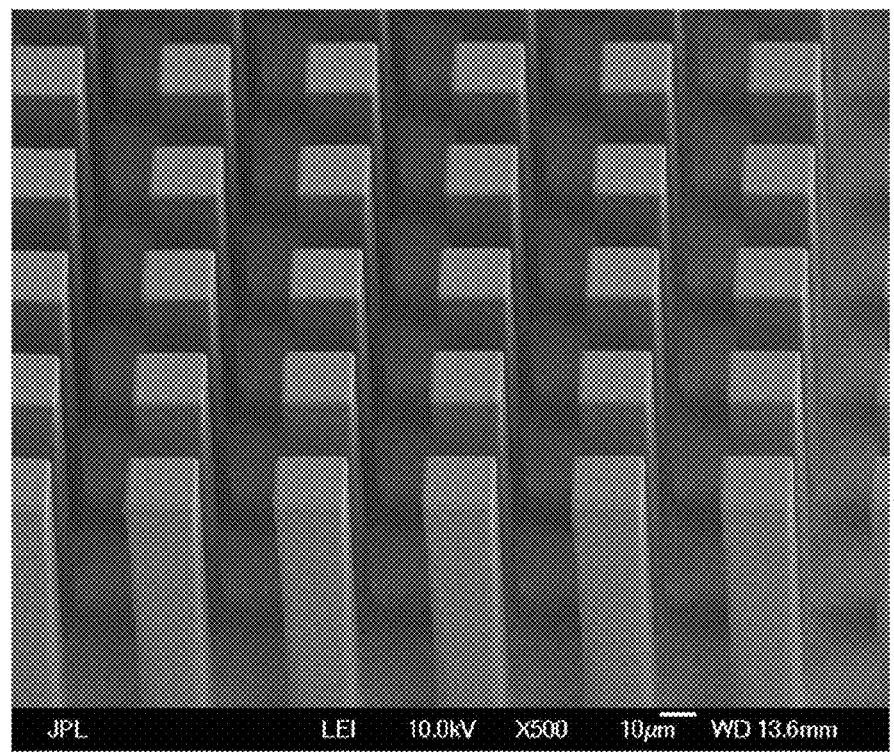
Figure 11A:
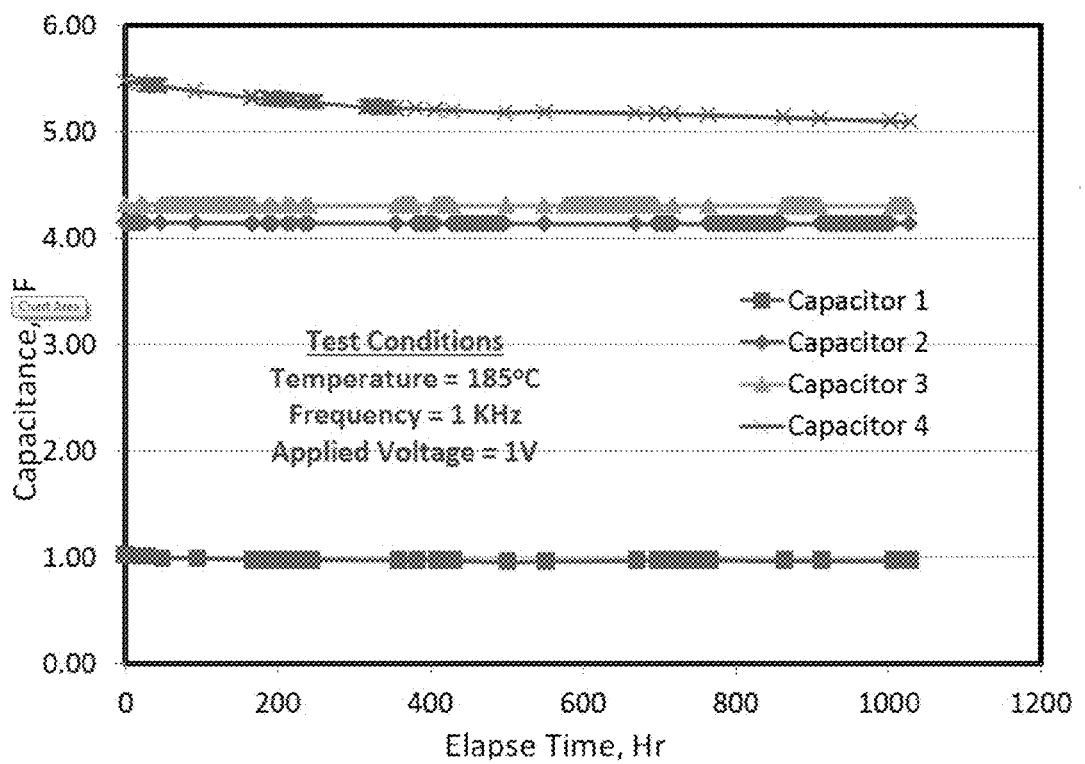
FIGS. 11A and 11B show the results of testing the capacitors depicted in FIGS. 10A and 10B.
Figure 11B:
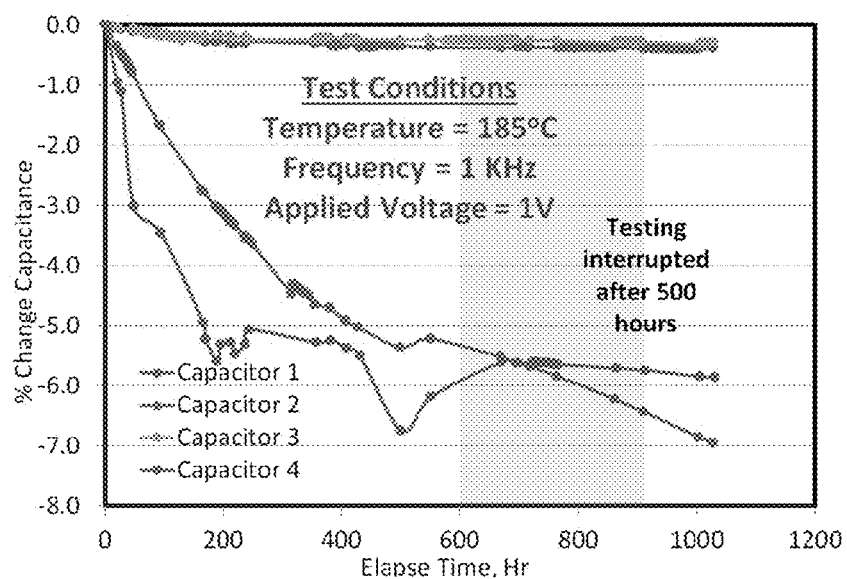
Figure 12:
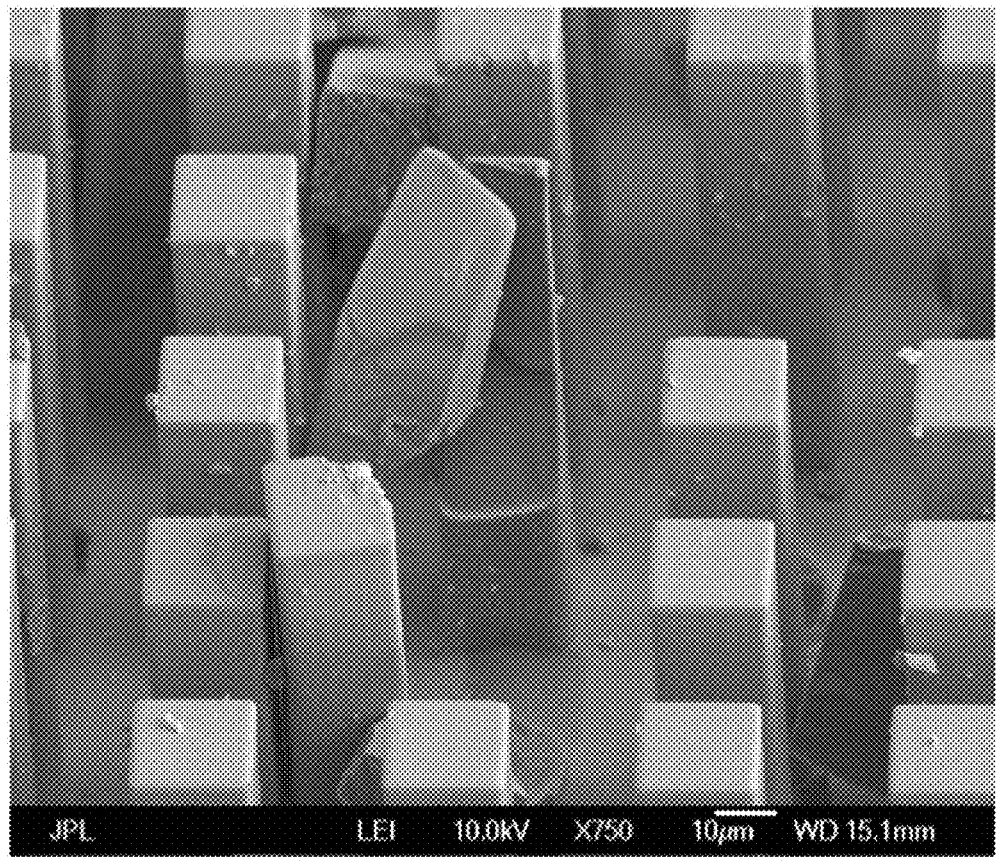
FIG. 12 shows that the capacitor depicted in 10A had been damaged and still performed adequately.

FIGS. 10A and 10B depict two capacitors that can function at high temperatures—185° C.—in accordance with embodiments of the invention. In particular, FIG. 10A depicts a capacitor utilizing a surface in the shape of an array square posts having lateral dimensions of 10 μm, and FIG. 10B depicts a capacitor utilizing a surface in the shape of square posts having lateral dimensions of 20 μm. The posts had a height of 61 μm, and were disposed on a 1 cm×1 cm die, with a capacitance area of 5 mm×5 mm. They utilized a 1 μm $SiO_2$ dielectric, and silicon and gold as the conductive materials. The operation of these capacitors was tested at 185° C.—FIGS. 11A and 11B show the results of the testing of the capacitors. In particular, FIG. 11A shows that the capacitances of four capacitors maintained their capacitance through the 1000 hours. Note that in the illustrated graphs, capacitors 1 and 4 correspond to that seen in FIG. 10A in that they employed posts that have a lateral dimension of 10 μm; whereas capacitors 2 and 3 correspond to that seen in FIG. 10B in that they employed posts that have a lateral dimension of 20 μm. Capacitors 1 and 4 were damaged prior to testing and still performed well. FIG. 12 depicts the damage of one of the capacitors.

As can be inferred from the above discussion, the above-mentioned concepts can be implemented in a variety of arrangements in accordance with embodiments of the invention. Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What claimed is:

1. A capacitor that incorporates a conductive element that conforms to the shape of an array of elongated bodies comprising:
    a first conductive element that conforms to the shape of an array of elongated bodies;
    a second conductive element that conforms to the shape of an array of elongated bodies; and
    a dielectric material that is disposed in between the first conductive element and the second conductive element, and thereby physically separates them;
        wherein each of a plurality of elongated bodies defined by either the first conductive element or the second conductive element extend into the dielectric material such that the end of a respective elongated body that extends into the dielectric material is surrounded on all sides by the dielectric material
        wherein the dielectric material comprises Polybenzimidazole.

2. The capacitor of claim 1, wherein:
    the first conductive element and the second conductive element are distinct structures that are configured to interdigitate, but not physically contact one another.

3. The capacitor of claim 2, wherein the inter-electrode gap is less than approximately 10 μm.

4. The capacitor of claim 2, wherein the first conductive element and the second conductive element each conform to the shape of an array of cylinders.

5. The capacitor of claim 2, wherein the first conductive element and the second conductive element each conform to the shape of an array of hexagonal elongated bodies.

6. The capacitor of claim 2, wherein the first conductive element and the second conductive element each constitute an array of elongated bodies.

7. The capacitor of claim 1, wherein the first conductive element and the second conductive element each constitute a coating deposited onto an array of elongated bodies.

8. The capacitor of claim 1, wherein:
    the first conductive element is a layer disposed onto an array of elongated bodies;
    the dielectric material is a layer that is disposed onto the first conductive element; and
    the second conductive element is a layer that is disposed onto the dielectric material.

9. The capacitor of claim 8, wherein the array of elongated bodies comprises conductive silicon.

10. The capacitor of claim 9, wherein the array of elongated bodies comprises a layer of dielectric material disposed onto the conductive silicon.

11. The capacitor of claim 10, wherein the first conductive element and the second conductive element each comprise TiN.

12. The capacitor of claim 11, wherein the dielectric material comprises $Al_2O_3$.

13. The capacitor of claim 8, wherein the array of elongated bodies comprises carbon nanotubes.

14. The capacitor of claim 13, wherein the array of elongated bodies comprises a silicon oxide layered onto the carbon nanotubes.

15. The capacitor of claim 14, wherein the first conductive element and the second conductive element each comprise TiN.

16. The capacitor of claim 14, wherein the dielectric material comprises $Al_2O_3$.

17. The capacitor of claim 16, further comprising:
    a second dielectric material;
    a third conductive element;

a third dielectric material;
a fourth conductive element;
a fourth dielectric material; and
a fifth conductive element;
wherein:
the second dielectric material is a layer disposed onto the second conductive element;
the third conductive element is a layer ha is disposed onto the second dielectric material;
the third dielectric material is a layer disposed onto the third conductive element;
the fourth conductive element is a layer that is disposed onto the third dielectric material;
the fourth dielectric material is a layer that is disposed on the fourth conductive element; and
the fifth conductive element is a layer that is disposed onto the fourth dielectric material.

18. The capacitor of claim 1, wherein the first conductive element, the second conductive element, and the dielectric material have similar coefficients of thermal expansion.

19. The capacitor of claim 1, wherein the first conductive element, the second conductive element, and the dielectric material allow the capacitor to operate at within a temperature range from approximately 20° C. to 360° C.

20. The capacitor of claim 1, wherein the dielectric material further comprises polyetheretherketone (PEEK).

21. The capacitor of claim 1, wherein the dielectric material comprises one of:
   Celazole U-60; Celazole U-60SD; Celazole U-60ESD; Celazole TU-60; Celazole TF-60C; Celazole TF-60B; and Celazole TL-60.

* * * * *